United States Patent [19]

Kyuma et al.

[11] Patent Number: 4,712,138
[45] Date of Patent: Dec. 8, 1987

[54] LOW-NOISE APPARATUS FOR IMAGE PICKUP AND COMBINATION OF LIGHT AND ELECTRIC SIGNALS

[75] Inventors: Kenji Kyuma, Kawasaki; Teruo Hieda, Yokohama, both of Japan

[73] Assignee: Canon Kabushiki Kaisha, Tokyo, Japan

[21] Appl. No.: 813,484

[22] Filed: Dec. 26, 1985

[30] Foreign Application Priority Data

Dec. 28, 1984 [JP]  Japan ................................ 59-276977

[51] Int. Cl.$^4$ ............................................. H04N 3/14
[52] U.S. Cl. ........................... 358/213.31; 358/213.13
[58] Field of Search ................ 358/213, 212; 250/578

[56] References Cited

U.S. PATENT DOCUMENTS 4,363,963  12/1982  Ando .................................... 250/578
4,531,156   7/1985  Nishizawa et al. ................. 358/213

*Primary Examiner*—Gene Z. Rubinson
*Assistant Examiner*—Stephen Brinich
*Attorney, Agent, or Firm*—Fitzpatrick, Cella, Harper & Scinto

[57] ABSTRACT

An image pickup-and apparatus comprising a pickup element including arranged non-destructively readable photoelectric conversion elements and an input device for inputting electric charges to the individual photoelectric conversion elements. The apparatus is capable of controlling signal charges stored in a non-destructive manner in the conversion elements.

18 Claims, 13 Drawing Figures

4,712,138

LOW-NOISE APPARATUS FOR IMAGE PICKUP AND COMBINATION OF LIGHT AND ELECTRIC SIGNALS

BACKGROUND OF THE INVENTION

Field of the Invention

The present invention relates to camera apparatus.

Recent research on photoelectric conversion devices and particularly solid state camera apparatus have been positively carried out in conjunction with the progress of semiconductor techniques, and the results of the research begin to be partially put to practical use.

These solid state camera apparatus are classified briefly into two types, the CCD and the MOS types. The CCD type camera apparatus employs the principle that potential wells formed under MOS capacitor electrodes of the apparatus store electric charges produced by incident rays, and, to read the charges, these wells are shifted sequentially with pulses applied to the electrodes, thereby transferring the stored charges to the output amplifier. There are some CCD type camera apparatus which each employ a pn junction diode structure as a light reception section and a CCD structure as a transfer section. On the other hand, the MOS type camera apparatus utilizes the principle that each of the pn junction photodiodes constituting the light reception section stores electric charges produced due to incident rays and, when the charges are read, the MOS switching transistors connected to the respective photodiodes are sequentially turned on, so that the stored charges are read out to the output amplifier.

The CCD type camera apparatus has a relatively simple structure. It also is subject to relatively low noise because only the capacitance of each of the electric charge sensors each including floating diffusion at the last stage of the apparatus contributes to the generation of random noise in terms of possible noise, thereby allowing photography at low illumination. Since, however, the restrictions on the process of forming the CCD type cameras cause a MOS type amplifier (provided as the output amplifier) to be disposed on a chip, a 1/f image noise which would be very noticeable in the image will be produced from the interface between the silicon substrate and the SiO$_2$ film thereon. Thus although the noise is at a low level, the performance of the CCD type camera apparatus is limited. If a camera having a high density of cells is produced by increasing the number of cells used to attain high resolution, the maximum quantity of electric charges which can be stored in a single well decreases and the desired dynamic range cannot be obtained, which would be a big problem in providing high resolution solid state camera apparatus in future. Since, in the CCD type camera apparatus, the stored charges are transferred while the respective potential wells are shifted sequentially, even the presence of only a single defective cell would stop or worsen the charge transfer extremely, thereby lowering the yield.

The MOS type camera apparatus is slightly more complicated in structure than the CCD type camera apparatus, especially, that of the frame transfer type. However, the former is superior to the latter in that the former can be constructed so as to have a larger storage capacitance and a larger dynamic range than the latter. In addition, although one of the cells be defective, it does not affect other cells adversely because the former employs the X-Y address system. Thus the former is more advantageous in yield than the latter. However, the MOS type camera apparatus has several faults: an extremely large signal voltage drop and hence an output voltage drop because of the connection of each photodiode to the corresponding wiring capacitance on signal reading; occurrence of large random noises because of the presence of large wiring capacitances; picking up of fixed pattern noise due to different inherent capacitances of the photodiodes and horizontal scan MOS switching transistors, and more-difficult low illumination photography compared with the CCD type apparatus.

In future high resolution camera apparatus, the size of each of the cells will be miniaturized and the quantity of stored charges will be decreased. However, the wiring capacitance determined by the chip size will not change significantly although the width of each wire is decreased. Thus the MOS type apparatus will become more and more disadvantageous in S/N ratio.

Although the CCD and MOS type camera apparatus have the above advantages and disadvantages, they are gradually approaching a level of practical use. However, it can be said that they suffer from the a following essential problem encountered in developing high resolution camera apparatus required in the future.

In connection with these solid state camera apparatus, new systems have been proposed in Japanese Unexamined Patent Publications (Kokai) Nos. 150878/1981 157073/1981 and 165473/1981 which are each entitled "Handotai Satuzo Sochi" (Semiconductor Camera Apparatus). As described above, the CCD and MOS type camera apparatus each store at their main electrodes (for example, the source of a MOS transistor) electric charges produced due to incident rays. In contrast, the systems proposed by the above published applications are based on a new concept, that the electric charges produced due to incident rays are stored at their control electrodes [for example, the base of a bipolar transistor or the gate of a SIT (static induction transistor) or a MOS transistor] and that the electric charges produced by light rays control a flow of current. That is, while the CCD and MOS types serve to read the stored electric charges outside thereof, the systems proposed in those published applications amplify the stored electric charges using the amplification function of each cell and then read the amplified charges. In other words, the latter reads the charges as a low-impedance output by impedance transformation. Thus the systems proposed in the latter have several advantages: high output, wide dynamic range, low noise and non-destructive reading due to the fact that the carriers (electric charges) excited by light signals are stored at the control electrodes thereof. In addition, they each have a probability of attaining high resolution in future.

However, these each employ the X-Y address system basically, and each include a basic element structure which comprises the composite of each of the cells of the conventional MOS type camera apparatus and an amplifying element such as a bipolar transistor or a SIT. Thus they each have a relatively complicated structure. In addition, although they each have a probability of attaining high resolution, there are limits to their resolution as they are.

The non-destructive reading characteristic of these sensors has been used only to hold the photographied image signal a relative short period of time compared to what is possible.

SUMMARY OF THE INVENTION

It is an object of the present invention to provide a new camera apparatus which has a simple structure in which each cell has an amplification function and which can cope satisfactorily with high resolution problems in the future.

It is another object of the present invention to provide a camera apparatus which has non-destructive reading and electric charge inputting functions, thereby obtaining special effects.

It is still another object of the present invention to provide a camera apparatus which can refresh each of the pixels and be read out in a non-destructive manner.

In order to attain these objects, an embodiment of the present invention is structured so as to include:

a camera or other pickup element including a plurality of arranged non-destructively readable photoelectric conversion elements; and input means for inputting electric charges to each of the photoelectric conversion elements, the input means including an input member for accepting a variable electrical signal and conversion means for deriving and inputting electric charges corresponding to the variable electrical signal to each of the photoelectric conversion elements, thereby refreshing the camera signal in a very simple manner.

Another embodiment of the present invention includes:

a plurality of photoelectric conversion elements, each including at least two main electrodes and a single control electrode, and a capacitor connected to the control electrode; and input means for inputting electric charges to the junction point of the capacitor and the control electrode, the input means controlling the amount of the electric charges input, in response to a variable electrical signal. Thus the camera apparatus is easily refreshed and an image signal is input easily.

Still another embodiment of the present invention includes:

a plurality of photoelectric conversion elements, each including at least two first main electrodes, a first control electrode, and a capacitor connected to the first control electrode; and input means for inputting electric charges to the junction point of the capacitor and the first control electrode, the input means including a second control electrode, a second main electrode, and a third main electrode, the second control electrode being connected to the opposite side of the capacitor from the first control electrode, the second main electrode being connected to the junction point of the capacitor and the first control electrode and the third being connected to a variable electrical signal source.

Thus, this embodiment has a simple structure which can refresh the camera apparatus and input an image signal thereto.

A further embodiment includes:

a camera or other image pickup element including a plurality of non-destructively readable photoelectric conversion elements disposed in a matrix including rows and columns; and input means for inputting electric charges to the respective photoelectric conversion elements a row unit, the input means including an input member for accepting an electrical signal and conversion means for deriving an inputting electric charges corresponding to the electrical signal to the respective photoelectric elements a row unit.

This arrangement facilitates the refreshment of the camera apparatus and the inputting of an image or picture signal thereto.

Other objects and features of the present invention will be apparent from the following specification and the accompanying drawings.

DETAILED DESCRIPTION OF THE PREFERRED EMBODIMENTS

The embodiments of the present invention will now be described in more detail with respect to the drawings.

Figure 1A:
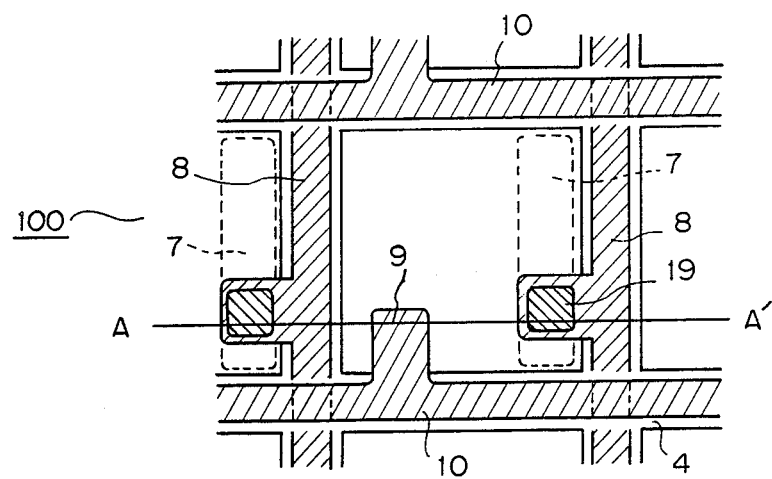
FIG. 1A is a top view of a photosensor cell.
Figure 1B:
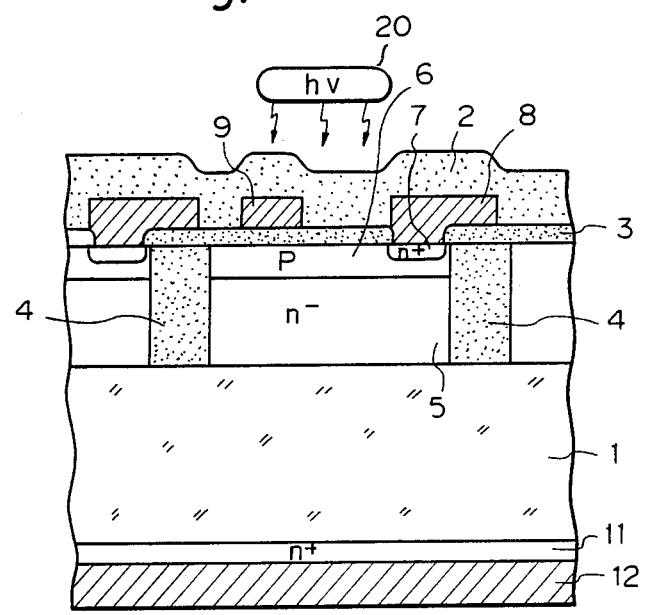
FIG. 1B is a cross-sectional view taken along line A-A' of FIG. 1A.
Figure 1C:
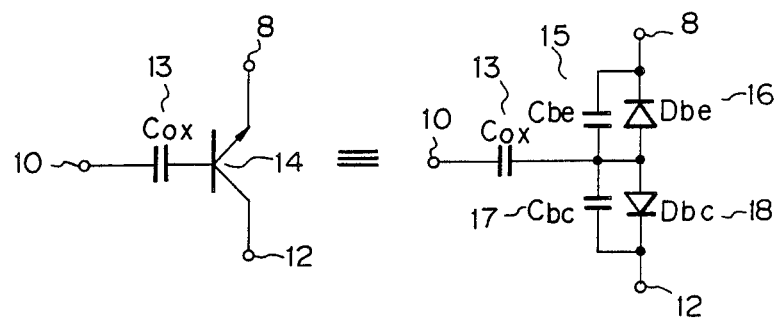
FIG. 1C is a diagram of a circuit equivalent to that of the photosensor cell.

FIG. 1 illustrates the basic structure of photosensor cells composing a photoelectric conversion device related to one embodiment of the present invention and the operation thereof. FIGS. 1A, 1B and 1C are a plan view of a photosensor cell 100 as a photoelectric conversion element, the cross-sectional view taken along line A-A' of FIG. 1A, and the equivalent circuit of the photosensor cell, respectively. The same reference numerals are applied to the same elements throughout FIGS. 1A, 1B and 1C.

While FIG. 1 shows, in plan view, one of the photosensor cells disposed in a regular member, it is of course possible to dispose the cells in a pixel shift or interposition manner in order to enhance the horizontal resolution.

As shown in FIGS. 1A and 1B, this photosensor cell is composed of:

a passivation film 2 usually including a PSG film formed on a silicon substrate 1 of an n or n+ type obtained by doping impurities including phosphorus (P), antimony (Sb), and arsenic (As) thereinto;

an insulation oxide film 3 including a silicon oxide ($SiO_2$) film;

an element separation area 4 composed of an insulation film of $SiO_2$ or $Si_3N_4$ or a polysilicon film for electrically insulating adjacent photosensor cells from each other;

an n⁻ area 5 of low impurity density formed using epitaxial techniques, etc.;

a p area 6 formed on n⁻ area 5 and constituting the base of a bipolar transistor obtained by doping impurities containing boron (B) into area 5 using impurity diffusion techniques or ion injection techniques;

an n+ area 7 constituting the emitter of a bipolar transistor formed using impurity diffusion techniques, ion injection techniques, etc.;

wiring 8 for reading out a signal, the wiring being made from an electrically conductive material such as aluminum (Al), Al-Si, or Al-Cu-Si, for example;

an electrode 9 for applying pulses to p area 6, placed in a floating state, through insulation film 3;

wiring 10 for electrode 9;

an n+ area 11 having high impurity density formed, using impurity diffusion techniques, for forming an ohmic contact on the back face of substrate 1; and an electrode 12 made of an electrically conductive material such as aluminium for applying a voltage level to the substrate and hence to the collector of the bipolar transistor.

In FIG. 1A, reference numeral 19 denotes a contact portion where n+ area 7 and wiring 8 are connected. The area where wiring 8 and 10 cross each other forms so-called two-layered wiring, the wiring 8 and 10 being insulated from each other in an insulation area formed of SiO₂ etc., i.e. a metal two-layered wiring structure results.

A capacitor Cox 13 of the equivalent circuit of FIG. 1C includes a MOS structure having electrode 9, insulation film 3 and p area 6. A bipolar transistor 14 as an active element is composed of n+ area 7 as an emitter which is a first main electrode, p area 6 as a base which is a first control electrode, n⁻ area 5 having low impurity density, and n or n+ area 1 as a collector which is a first main electrode. As is clear in these figures, p area 6 is formed as a floating area. It should be noted that the number of first main electrodes is not limited to two.

A second equivalent circuit of the photosensor cell of FIG. 1C represents bipolar transistor 14 using base-emitter junction capacitance Cbe 15, a base-emitter pn junction diode Dbe 16, base-collector junction capacitance Cbc 17 and a base-collector junction diode Dbc 18.

The basic operation of the photosensor cell will now be described with respect to FIG. 1.

This basic operation of the cell is composed of storage of electric charges due to incident light rays, reading and refreshing of the charges. In the storage of electric charges, the emitter, for example, is grounded via wiring 8 while the collector is biased to a positive potential via wiring 12. The base should be biased in the opposite direction to emitter 7, that is, to a negative potential by applying a positive pulse voltage in advance via wiring 10 to capacitor Cox 13. The operation in which a pulse is applied to Cox 13 to bias base 6 to a negative potential will be described in more detail in the refreshing operation to be described later.

Under these conditions, if light 20 enters the front face of the photosensor cell, as shown in FIG. 1, then electron-hole pairs are produced in the semi-conductor. The electrons of the pairs flow to n+ area 1 because that are a is biased to the positive potential whereas the holes are rapidly accumulated in p area 6. This causes the potential of p area 6 to change toward a positive potential.

The underside of the light reception face of each sensor cell in FIGS. 1A and 1B is occupied almost entirely by the p area, except for partial n+ area 7. Of course, the density of electron-hole pairs excited by light increases toward the reception face of the cell. Thus many electron-hole pairs are also excited in the p area 6 by light. If the photosensor cell has such a structure that the electrons excited in the p area by light immediately flow out of the p area 6 without recombination and are absorbed by the n area, the holes excited in p area 6 will be accumulated as they are, thereby changing p area 6 toward positive potential. If the density of impurities in p area 6 is uniform, the electrons excited by light flow to the pn⁻ junction of p area 6 and n⁻ area 5 in a diffusive manner and are then absorbed by n collector area 1 by a strong electric field applied across the n⁻ area. Of course, the running of the electrons in p area 6 may be performed only in a diffusive manner. On the other hand, if the density of the impurities in the p base is arranged so as to decrease inward from the face of the cell, the difference between the densities of the impurities causes an electric field to be produced in the base, the field having a direction pointing from the inside of the cell toward the cell face, the field being expressed by $$E_d = (1/W_B) \cdot (kT/q) \cdot (\ln N_{AS}/N_{Al})$$

where $W_B$ is the depth of p area 6 from the cell face which light enters, k is the Boltzmann constant, T is the absolute temperature, q is the unit charge, $N_{AS}$ is the density of the impurities at the surface of p base area 6, and $N_{Al}$ is the density of the impurities at the interface of p area 6 and n⁻ high resistance area 5.

Here, if $N_{AS}/N_{Al} > 3$, the running of electrons in p area 6 will be due to drift rather than due to diffusion. In other words, in order to cause the carriers excited in p area 6 by light to operate effectively as a signal, it is desirable that the density of the impurities in p area 6 decrease inward from the cell face which light enters. If p area 6 is formed using diffusion techniques, the density of the impurities in the area will decrease inward from the cell face which light enters.

Part of the photosensor cell underlying the light reception face thereof is occupied by n+ area 7. The depth of n+ area 7 is designed so as to be usually substantially between 0.2 and 0.3 μm, or more than 0.3 μm, so that the quantity of light absorbed in n+ area 7 is naturally not so much and is negligible except that the presence of n+ area 7 is the cause of a decrease in the sensitivity to light rays having short wavelengths, especially, to blue light. The density of the impurities in n+ area 7 is designed to be usually $1 \times 10^{20}$ cm⁻³ or more. The diffusion distance of holes in n+ area 7 in which impurities are doped in such high density is between 0.15 and 0.2 μm. Thus, in order to effectively pass the holes excited in n+ area 7 by light to p area 6, it is desirable that the density of the impurities in n+ area 7 also decreases inward from the cell face which light enters. If the distribution of the impurity density in n+ area 7 is as described above, a strong drift electric field which has a direction pointing inward from the cell face which light enters will be produced and the holes excited in n+ area 7 by light immediately flow into p area 6 in a drift manner. If arrangement is such that both the densities of impurities in n+ and p areas 7 and 6 decrease inward from the cell face which light enters, all the carriers excited by light in n+ and p areas 7 and 6 which are present at the cell face which light enters act effectively as light signals. If this n+ area 7 is formed by diffusion of impurities from the silicon oxide film or the polysilicon film in which As or P is doped in high density, an n+ area which has a desirable impurity density gradiant such as is described above will be obtained.

The base potential will change eventually to the emitter potential, in this particular case, to ground level due to the accumulation of holes and be clamped to the ground level. More strictly speaking, it will be clamped to such a voltage that the holes accumulated at the base begin to flow out to the emitter as a result of the fact that enough forward bias is applied across the base and emitter. That is, in this case, the saturation potential of the photosensor cell is given by substantially the difference between ground potential and the negative voltage to which p area 6 has been biased initially. The electric charges produced by light in p area 6 in the floating state without grounding n+ area 7 can be stored in p area 6 to substantially the same potential as that of n+ area 1. As described above, in the MOS type camera apparatus, there is a problem that a good S/N ratio cannot be obtained because of large fixed pattern noise due to different inherent capacitances of MOS transistors to read out signals or due to large random noise which is in turn due to large wiring or output capacitance. However, in the photosensor cell of FIGS. 1A, 1B and 1C, the very accumulated potential produced in p area 6 is read out. This potential is significantly high, so that the fixed pattern noise and the random noise due to the output capacitance are relatively low, so that a signal having excellent S/N ratio is obtained.

Another advantage of the particular photosensor cell is that the holes stored in p area 6 can be read in a non-destructive manner because there is a very low probability that the electrons and holes will recombine in the p area 6. In more detail, when the voltage $V_R$ applied to electrode 9 is returned to zero volts on reading, the potential of p area 6 returns to the oppositely biased state before the voltage $V_R$ is applied and the accumulated voltage $V_p$ produced with irradiation of light remains as it is for as long as the cell is not irradiated with new light. This means that if the particular photosensor cell is used as a photoelectric conversion device, it can provide new functions in system operation.

The time for which the accumulated voltage $V_p$ is held in p area 6 is very long and the maximum hold time is limited by a dark current produced thermally in a depletion layer of the junction because the photosensor cell is saturated by this dark current. In the particular photosensor cell, the area where the depletion layer extends is n− area 5 of low impurity density; of $10^{12}$ to $10^{14}$ cm$^{-3}$. Thus, this very low density causes the crystallinity of the cell to be excellent and the number of electron-hole pairs thermally produced is small compared with that in the MOS and CCD type camera apparatus. Accordingly, the dark current in the particular photosensor cell is small compared with that in the conventional apparatus. In other words, the particular photosensor cell has a structure in which the dark current noise is essentially small.

The operation of refreshing the electric charges stored in p area 6 will be described next.

In the particular photosensor cell structured as above, the electric charges stored in p area 6 do not disappear during reading, as described. Thus, in order to input new information, a process, i.e. refreshing, is required for causing the previously stored charges to disappear. At the same time, p area 6 in the floating state must be charged in advance to a predetermined negative voltage.

In the particular photosensor cell, refreshing is performed in the same manner as reading, i.e. by applying a positive voltage via wiring 10 to electrode 9, at which time the emitter is grounded via wiring 8 with the collector being grounded via electrode 12 or connected to a positive potential.

The above is the illustration of the basic operation of the particular photosensor cell including storage of electric charges due to incident light, and reading and refreshing of the electric charges.

As described above, the basic structure of the particular photosensor cell is very simple compared with those of the above Japanese Unexamined Patent Publications (Kokai) Nos. 150878/1981, 157073/1981 and 165473/1981, can contribute sufficiently to high resolution in the future, and keeps the same advantages as those of low noise, high output and wide dynamic range, and non-destructive reading deriving from the amplification function that is an excellent feature of the structure disclosed in each of the cited published Japanese applications.

An embodiment of a photoelectric conversion apparatus according to the present invention which includes a two-dimensional arrangement of photosensor cells, each being described above, will be described with respect to FIG. 2.

Figure 2:
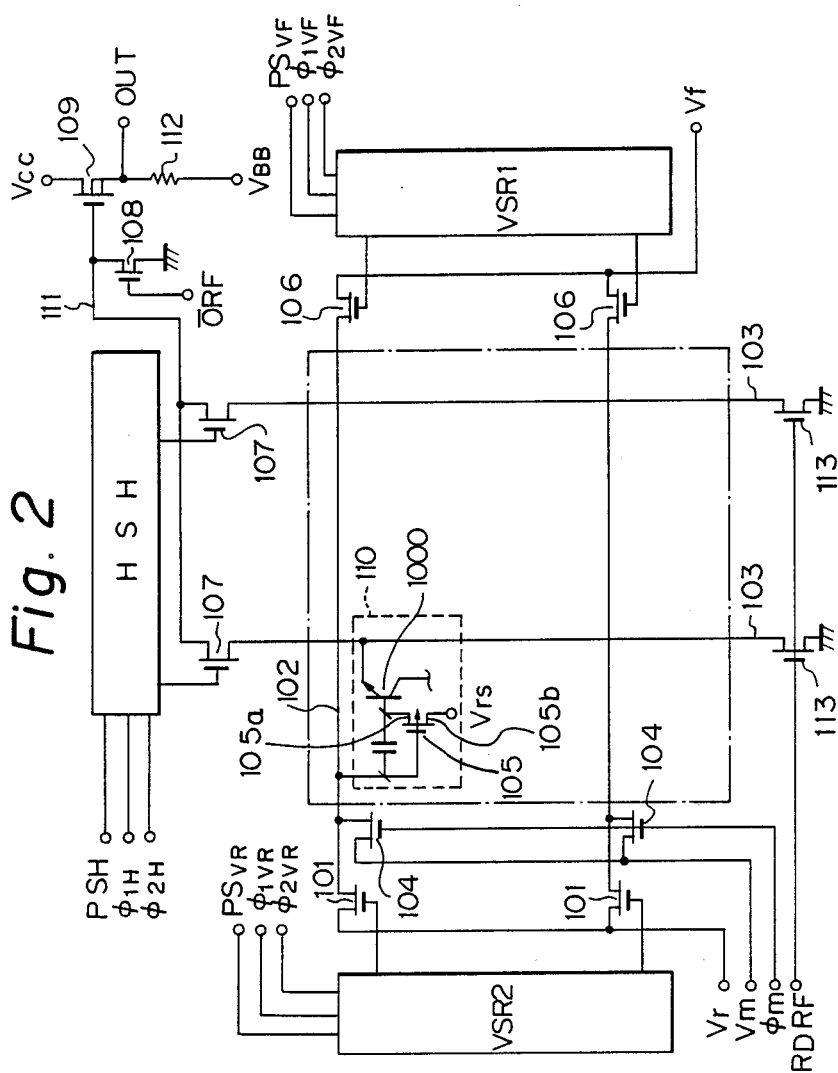
FIG. 2 is a circuit diagram of an embodiment of a solid state camera apparatus having a two-dimensional array of photosensor cells according to the present invention.

In FIG. 2, the apparatus includes a basic photosensor cells 110 (in this case, the collector of a bipolar transistor 1000 is shown to be connected with the substrate and the substrate electrode of the transistor), as already described and in the broken line, horizontal lines 102 to which read and refresh pulses are applied, a vertical shift register VSR2 which generates read pulses, MOS transistors 101 disposed between vertical shift register VSR2 and the respective horizontal lines 102 as capacitor control means, MOS transistors 106 which each apply a refresh pulse, vertical lines 103 as read means which each read the accumulated voltage from a corresponding basic photosensor cell, a horizontal shift register HSH which generates a pulse to select one of the vertical lines, gate MOS transistors 107 which open and close the respective vertical lines, an output line 111 which reads the respective accumulated voltages to the amplifier section, a MOS transistor 108 which refreshes the electric charges stored on the output line after reading, a terminal $\overline{ORF}$ via which a refresh pulse is applied to MOS transistor 108, a transistor 109 which may be a bipolar or MOS transistor, FET or J-FET to amplify an output signal, a load resistor 112, a transistor output terminal OUT, MOS transistors 113 which each refresh the electric charges stored on a corresponding vertical line in the reading operation, charge-injection transistors 105 as input means which each are connected between the transistor base and the capacitor within a photosensor cell 110, transistors 104 which each supply a potential Vm to a corresponding horizontal line 102 to bias same and a reflesh vertical shift register VSR1. The gate electrode (second control electrode) of each transistor 105 is connected to a corresponding line 102. A second main electrode 105a is connected to the corresponding base of transistor 1000. An electrode 105b (third main electrode) of each transistor 105 is connected to Vrs. Reference numerals PSH denotes a pulse to start HSH, reference characters $\phi_{1H}$, $\phi_{2H}$, pulses to drive HSH; reference character Vcc, a power supply;

reference character PS$_{VR}$, a pulse start VSR2; reference numerals $\phi_{1VR}$, $\phi_{2VR}$, pulses to drive VSR2; reference character PS$_{VF}$, a pulse to start VSR1; reference characters $\phi_{1VF}$, $\phi_{2VF}$, pulses to drive VSR1; reference character Vf, a refresh reference voltage, for example, of −3 V; reference character Vr, a read voltage, for example, of +10 V; reference character Vm, a bias, for example, of +5 V for each of the horizontal lines 102; reference character $\phi_m$, a gating pulse; reference character RDRF, a refresh gating pulse; and reference character Vrs, a reset voltage.

The electric charges obtained by photoelectric conversion of incident light to camera section 100 are stored at the base area of the transistor of each of the photosensor cells composing camera section 100.

When signals are to be read, a read pulse voltage Vr is applied to the bases of transistors 101 in the horizontal line designated by VSR2 to amplify and store the electric charges stored in the base areas of the transistors in the corresponding vertical lines 103. The electric charges stored at vertical lines 103 are then read sequentially by HSH in the horizontal direction. When the signals for one line are taken out, VSR2 designates the next line and signal reading is performed in the same manner as that described above in accordance with the period of the television signal.

Figure 3:
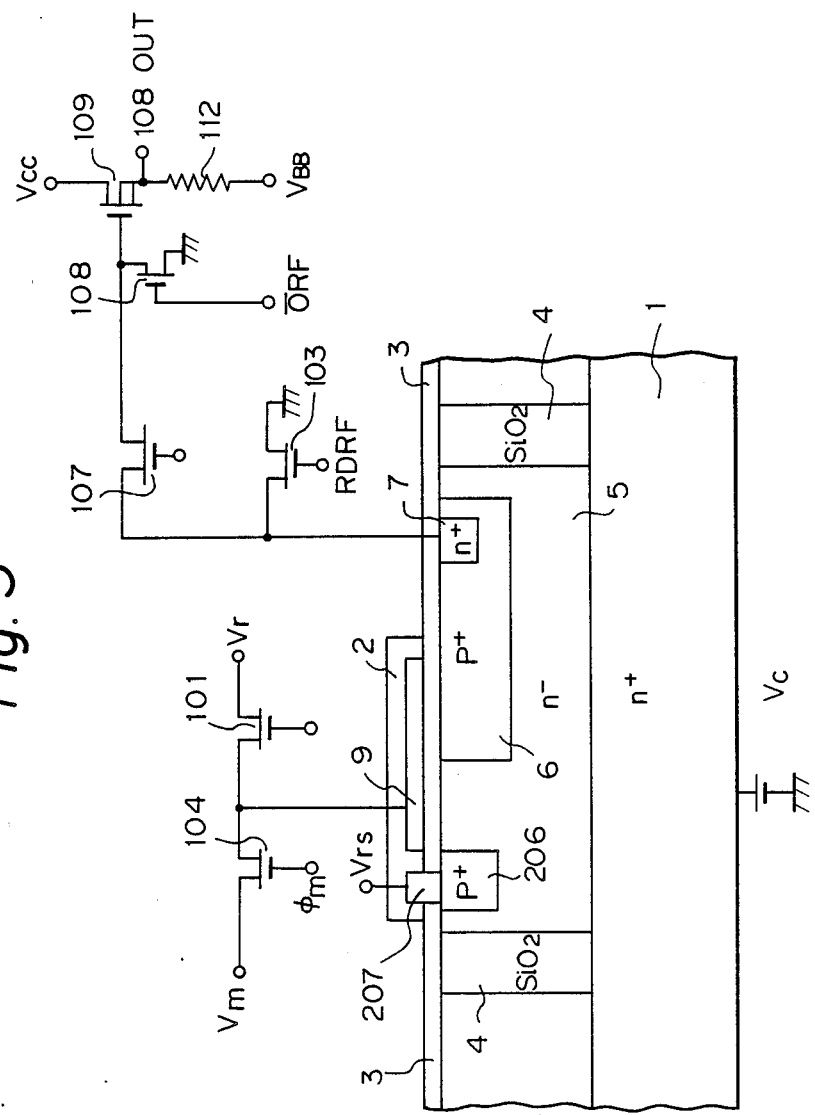
FIG. 3 is a schematic cross-sectional view of the photosensor cell of FIG. 2.

FIG. 3 shows the essential portion of sensor cell 110. The same reference numeral as that in FIG. 1B denotes the same element. Reference numeral 206 denotes a p+ layer which forms the transistor source. Reference numeral 207 denotes the gate electrode which will be impressed with a reference voltage Vrs to reset the base.

Figure 4A:
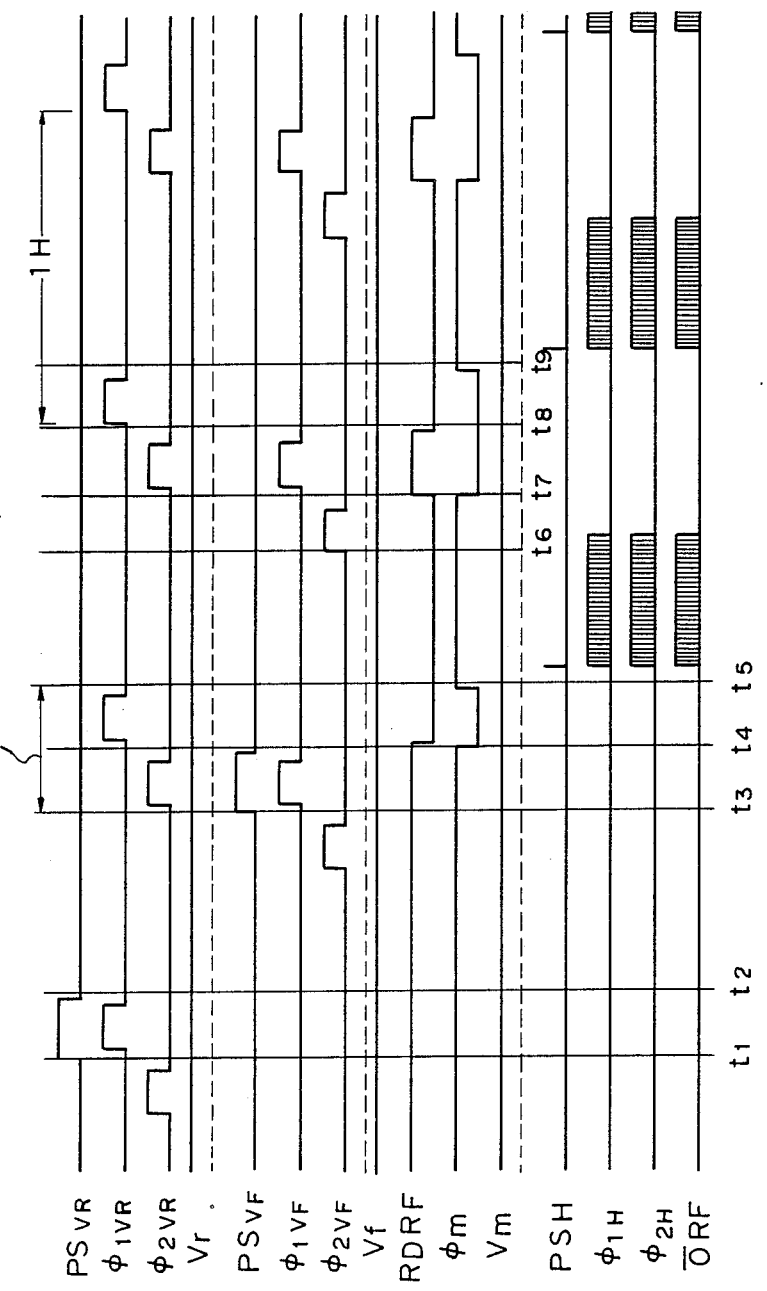
FIGS. 4A and 4B are timing charts of driving the camera apparatus of FIG. 2.
Figure 4B:
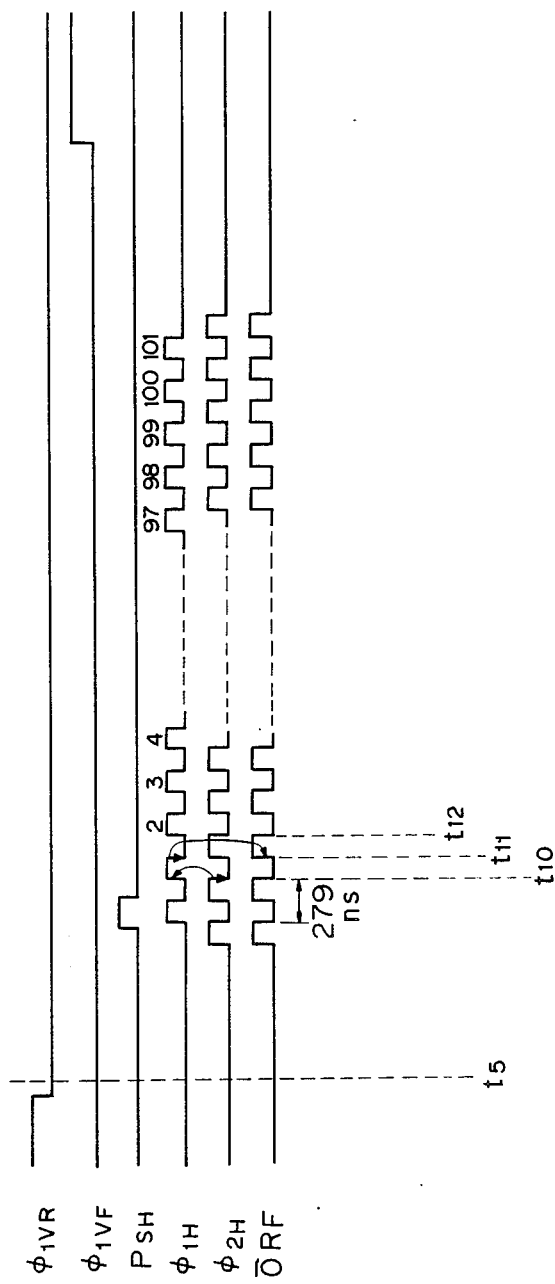

FIGS. 4A and 4B are timing charts for drive voltages. Reference character T$_1$ (between t$_4$ and t$_5$) denotes an interval during which the electric charges stored in the base area 6 are amplified by the transistor including elements 1, 5, 6, 7 and stored in the emitter inter-line capacity. In this case, if h$_{FE}$ is selected to have a large value, the electric charges in the base area hardly decrease. Reference numeral T$_2$ (between t$_5$ and t$_7$) denotes an interval during which the charges stored in the emitter inter-line capacity are read out by HSH. Reference character T$_3$ (between t$_7$ and t$_8$) denotes an interval during which the charges stored in the emitter inter-line capacity and in the base area are discharged. At this time the potential of the base area changes to reset voltage Vrs.

In more detail, when P$_{SVR}$ changes to high level during the interval from t$_1$ to t$_2$, shift register VSR2 starts. After P$_{SVR}$ changes to low level, $\phi_{1VR}$, $\phi_{2VR}$ are accepted.

Thus, during the interval from t$_3$ to t$_4$, $\phi_{2VR}$ causes one bit to shift in the shift register and subsequently during the interval from t$_4$ to t$_5$, $\phi_{1VR}$ changes to high level to apply the Vr level to the first line.

Since RDRF is at high level until this time t$_4$, transistor 113 has been turned on and the respective signals on the vertical lines 103 have been refreshed. Since $\phi_m$ is also at high level, bias voltage Vm is applied to horizontal line 102 and the electric charges are stored in the respective sensor cells. The interval from t$_3$ to T$_5$ corresponds to a horizontal blanking interval.

At a time t$_4$, $\phi_m$ and also RDRF change to low level, so that the reading of the electric charges becomes possible. Immediately after this, $\phi_{1VR}$ changes to high level, so that the respective charges stored in the base of the sensor cell 110 is shifted to the corresponding vertical lines 103.

Then after t$_5$, horizontal shift register HSH is supplied with P$_{SH}$ and thus started. The respective signals at the vertical lines 103 are supplied sequentially by $\phi_{1H}$, $\phi_{2H}$, $\overline{ORF}$ to MOS transistor 109 and read out. Immediately after this reading, the gate voltage of transistor 109 is reset. During the interval from t$_5$ to t$_7$, $\phi_m$ is at high level while the horizontal line is impressed with bias voltage Vm.

At a time t$_6$, refresh shift register VSR1 is shifted one bit by $\phi_{2VF}$, thereby designating the horizontal line 102 composing the first row. Subsequently at a time t$_7$, $\phi_{2VR}$ causes VSR1 to apply a low level Vf to the first row horizontal line 102. This causes transistor 105 to be turned on and the base charge of sensor cell 110 is refreshed, so that the base of the sensor cell changes to level Vrs.

During the interval from t$_7$ to t$_8$, vertical shift register VSR2 is supplied with $\phi_{2VR}$ and shifted one bit. Subsequently during the interval from t$_8$ to t$_9$, VSR2 is supplied with $\phi_{1VR}$, so that the electric charges in the sensor cells in the second row are shifted to the corresponding vertical lines 103. During the interval from t$_7$ to t$_9$, $\phi_m$ is at low level. In this way, the electric charges in the respective sensor cells are read sequentially in accordance with the television period.

FIG. 4B shows the details of horizontal reading timings. In this figure, the electric charges stored in the sensor cells in the first row are shifted by $\phi_{1VR}$ to the corresponding vertical lines 103. At a time t$_{10}$ when P$_{SH}$ falls, the subsequent fall of $\phi_{2H}$ causes the first column to be designated, the subsequent fall of pulse $\phi_{1H}$ at time t$_{11}$ causes the electric charges on the vertical line composing the first column to be supplied to the base of transistor 109. During the interval from t$_{11}$ to t$_{12}$, these charges are refreshed with $\overline{ORF}$.

Figure 5:
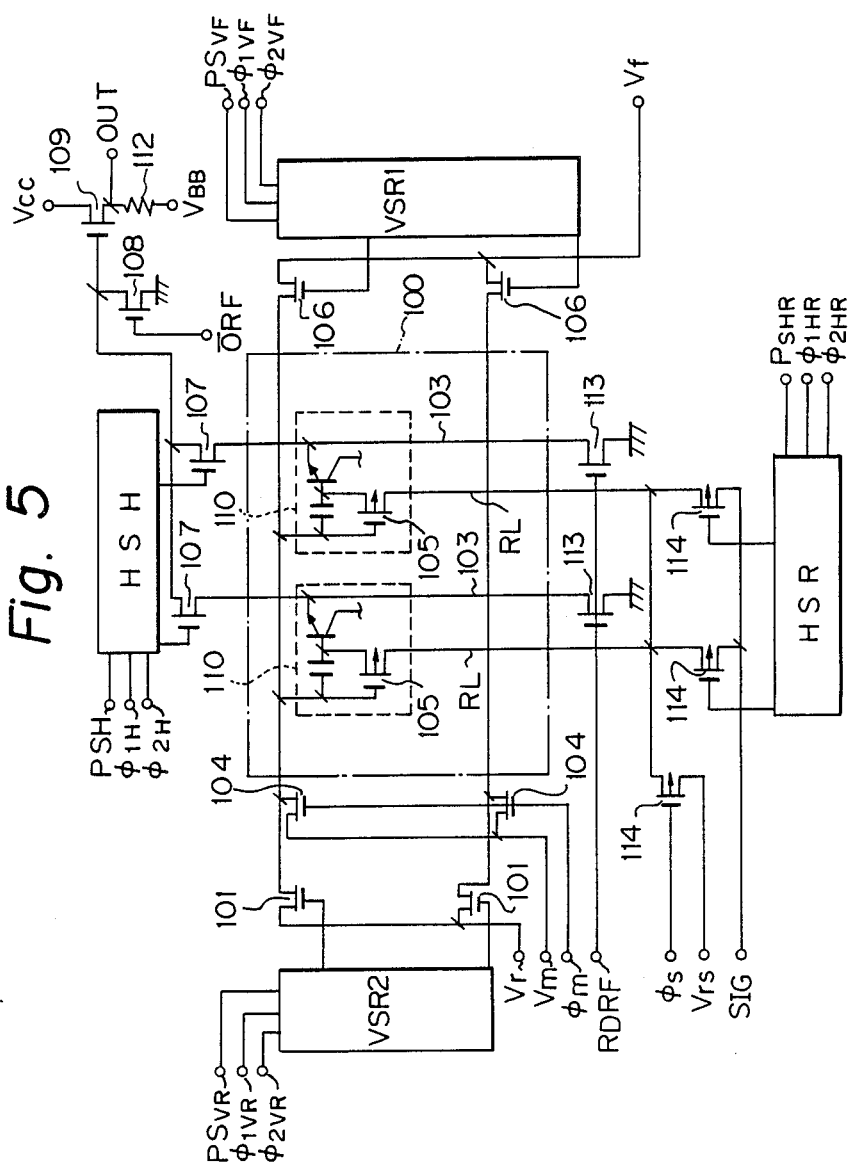
FIG. 5 illustrates a second embodiment of the camera apparatus of the present invention.

FIG. 5 illustrates a second embodiment of the present invention. The same reference character or numeral as in FIGS. 1–3 denotes similar elements. Reference character HSR denotes a write shift register. Reference numeral 114 denotes transistors which are turned on by the respective outputs of this register and which are connected together to transistor 105 of the same sensor cell. A transistor 114' is turned on in the read mode and controls the reset potential of each sensor cell to a fixed level. Instead of transistor 114', a fixed level may be applied to SIG in the read mode. Reference character SIG denotes a write signal input terminal; reference character PS$_{HR}$ denotes a pulse to start HSR; reference character $\phi_{1HR}$, $\phi_{2HR}$, a pulse to start HSR; and reference character $\phi_s$, a switching pulse.

Figure 6:
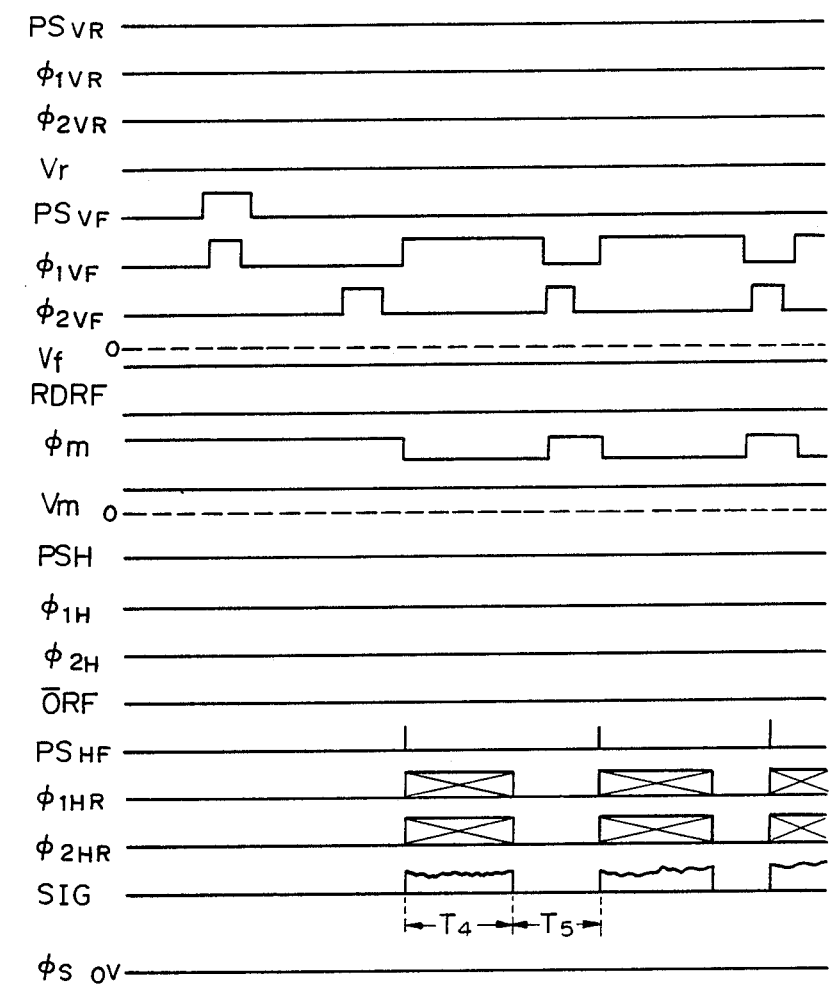
FIG. 6 is a timing chart of driving the embodiment of FIG. 5 at the time of writing.

FIG. 6 is a timing chart for the drive voltages in the write mode. Reference characters T$_4$ and T$_5$ denote a write interval and a horizontal blanking interval, respectively. During writing, $\phi_{1VF}$ is at high level to turn on transistor 105. That is, in the line designated with start pulse PS$_{VF1}$ and drive pulses $\phi_{1VF}$, $\phi_{2VF}$, the potential of the base area 6 for the pixel designated with start pulse PS$_{HR}$ and drive pulses $\phi_{1HR}$, $\phi_{2HR}$ after $\phi_m$ is changed to low level, can be determined with a voltage input from SIG. During an interval T$_5$, the next line is processed in the same manner as above. This processing is repeated in the vertical and horizontal directions in the same manner as in the television scanning, thereby writing information into all the pixels. It is noticed that in this write mode, $\phi_s$ is at zero level, so that transistor 114' is in the off state.

Figure 7:
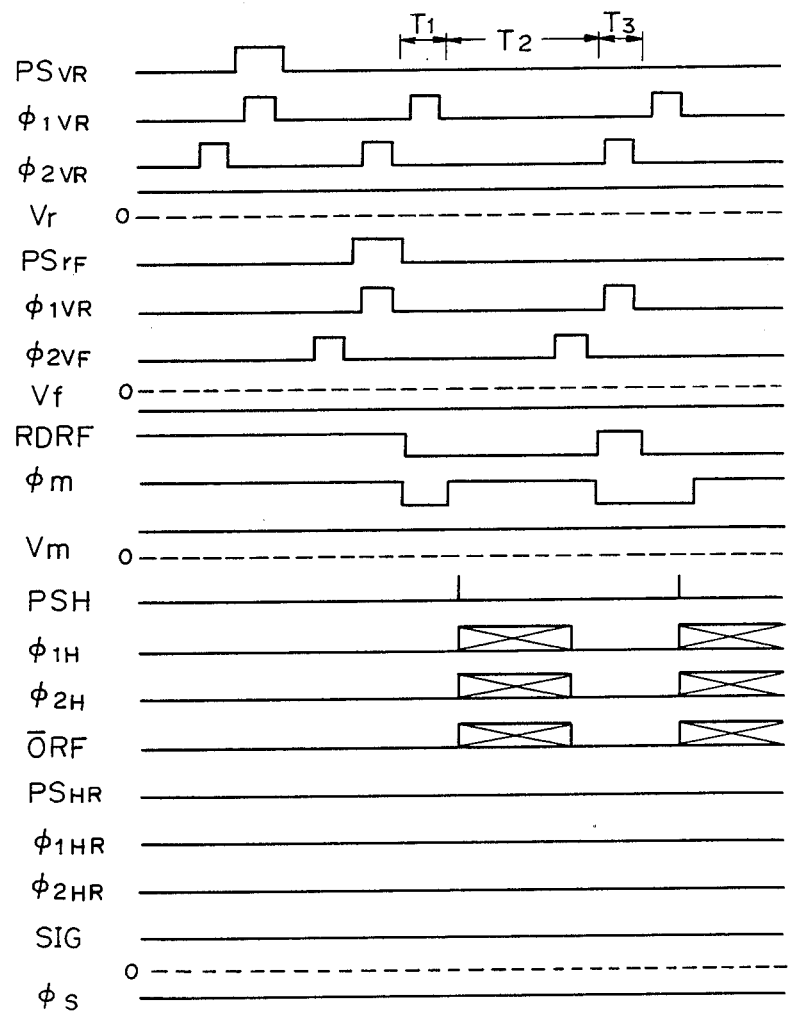
FIG. 7 is a timing chart of driving the embodiment of FIG. 5 at the time of reading.

FIG. 7 is a timing chart for the drive voltage in the read mode. Basically, the timing is the same as the read timing shown in FIG. 3. In that mode, the potential of base area 6 is at a fixed level Vrs all the time by changing $\phi_s$ to a negative voltage.

Figure 9:
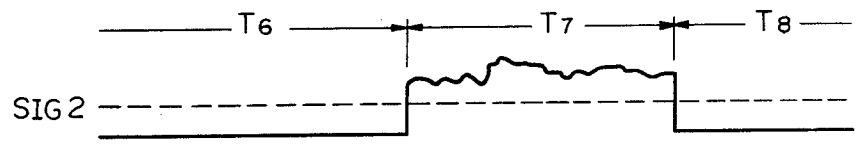
FIG. 9 shows an example of the input signal.
Figure 8:
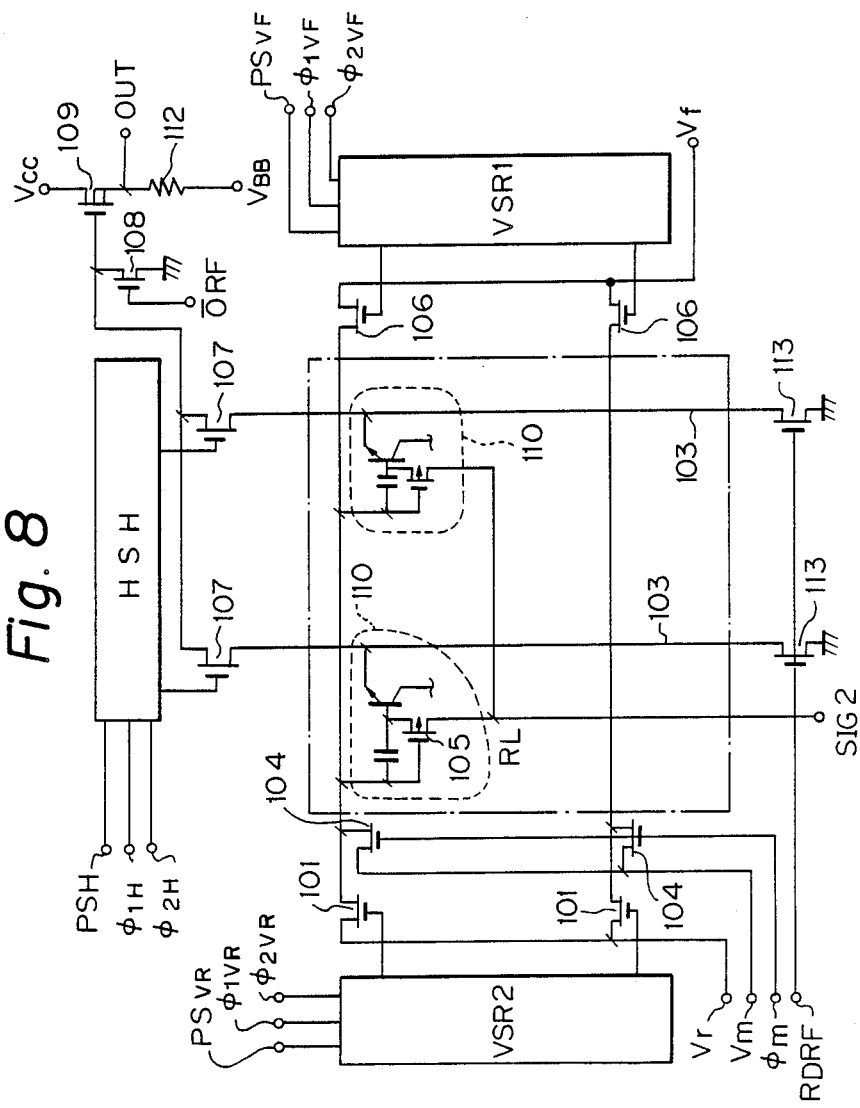
FIG. 8 is a schematic of a third embodiment of the camera apparatus of the present invention.
Figure 10:
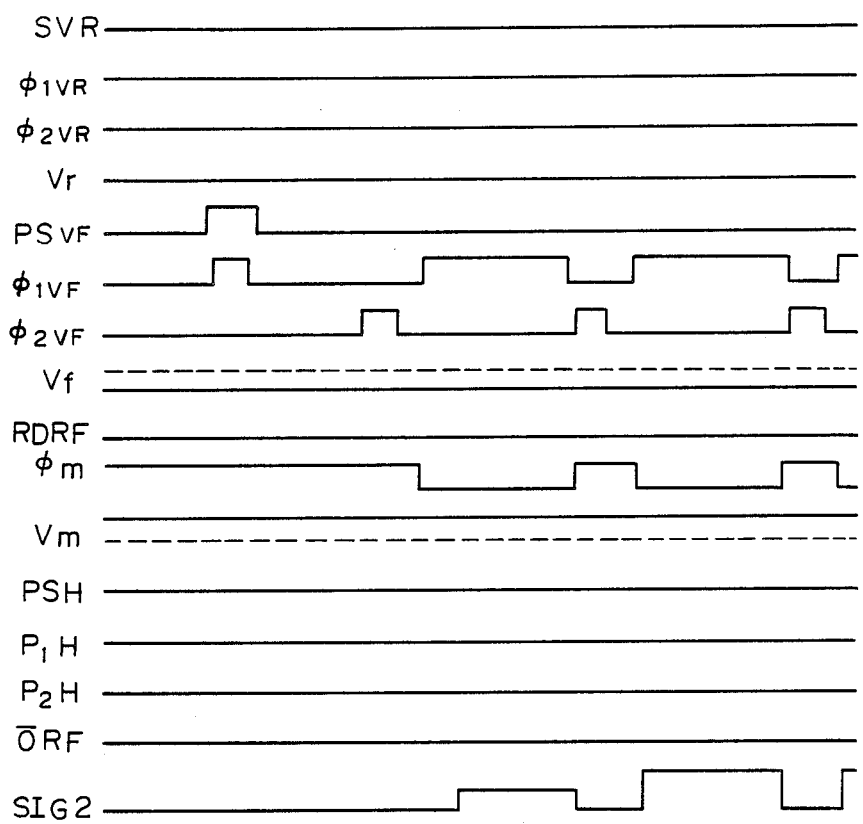
FIG. 10 is a timing chart of driving the embodiment of FIG. 8.

FIG. 8 shows the structure of a third embodiment which enables writing for each line. Reference character SIG2 denotes a signal input terminal to which the respective drains of transistors 105 of sensor cells 110 are together connected. FIG. 9 shows an example of the voltage waveform of SIG2. Reference characters $T_6$, $T_8$ denote read mode intervals. Reference character $T_7$ denotes a write mode interval. SIG2 is fixed to a given reset voltage all the time during $T_6$, $T_7$. During $T_7$, the SIG2 is changed in accordance with the input voltage. The timing chart of the voltage waveform during $T_6$ and $T_8$ is the same as in FIG. 4. The timing chart during $T_7$ is shown in FIG. 10. (The waveform of SIG is merely as an example.)

In FIG. 10, $\phi_{1VF}$ is at high level for a single H interval during which SIG2 applies a fixed level to the sensor cells a row unit at a time. Thus a fixed signal can be written into the sensor cells 110 in each row, all the sensor cells being disposed in rows and columns. The particular embodiment is simpler in structure than the first embodiment.

As described above, according to these embodiments, a signal can be input to non-destructively readable camera elements, so that field correlation processing or time base transform is possible on an image obtained by photographing without using field memories. In addition, the register which is used for designating a row to be refreshed is used for designating a row to be written in, so that the entire apparatus structure is simplified. If, in the write mode, an image signal is input to SIG and the shutter is then opened, an image can be obtained in which the image on the 302 SIG image and the photographied image are superimposed.

The present apparatus can be used not only as a camera element, but also as an analog memory by storing analog signals in the base areas of the sensor cells of the apparatus. In addition, in such a use, non-destructive reading is possible, so that the frequency of rewriting stored signals is small compared with conventional analog memories. Thus a multifunction camera apparatus in which signals are used without significant deterioration are obtained.

As described above, according to the present invention, there is provided input means for inputting electric charges to respective non-destructively readable photoelectric conversion elements, so that an image signal can be superimposed simply on an image formed by photographing.

What is claimed is:

1. An image pickup apparatus comprising:
   (a) an image pickup element including a plurality of arranged non-destructively readable photoelectric conversion elements; and
   (b) input means for inputting electric charges to each of said photoelectric conversion elements, said input means including an input member selectively connected to a variable electrical signal source and conversion means for inputting electric charges corresponding to said variable electrical signal to each of said photoelectric conversion elements.

2. An image pickup apparatus according to claim 1, wherein each of said photoelectric conversion elements includes an active element having an amplification function.

3. An image pickup apparatus according to claim 2, wherein said active element includes a transistor.

4. An image pickup apparatus according to claim 3, wherein said transistor includes a bipolar transistor.

5. An image pickup apparatus according to claim 3, wherein said transistor includes at least two main electrodes and a single control electrode.

6. An image pickup apparatus according to claim 5, wherein said photoelectric conversion includes a capacitor connected to said control electrode.

7. An image pickup apparatus according to claim 5, wherein said capacitor includes a MOS capacitor.

8. An image pickup apparatus comprising:
   (a) a plurality of photoelectric conversion elements, each including at least two main electrodes and a single control electrode, and a capacitor connected to said control electrode; and
   (b) input means for inputting electric charges to the junction point of said capacitor and said control electrode, said input means being selectively connected to a variable electrical source and controlling the amount of said electric charges in response to a variable electrical signal from said source.

9. An image pickup apparatus according to claim 8, wherein said capacitor includes a MOS capacitor.

10. An image pickup apparatus according to claim 8, further including read means for reading the electric charges in said photoelectric conversion elements via one of said main electrodes of each said photoelectric conversion element.

11. An image pickup apparatus according to claim 8, further including capacitor control means for controlling the potential of said capacitor, said capacitor control means being connected to the opposite side of said capacitor from said control electrode.

12. An image pickup apparatus according to claim 10, further including capacitor control means for controlling the potential of said capacitor, said capacitor control means being connected to the opposite side of said capacitor from said control electrode.

13. An image pickup apparatus according to claim 11, further including means for conducting a signal to said input means via said capacitor control means.

14. An image pickup apparatus according to claim 12, further including means for conducting a signal to said input means via said capacitor control means.

15. An image pickup apparatus comprising:
   (a) a plurality of photoelectric conversion elements, each including at least two first main electrodes, a first control electrode, and a capacitor connected to said first control electrode; and
   (b) input means for inputting electric charges to the junction point of said capacitor and said first control electrode, said input means including a second control electrode, a second main electrode, and a third main electrode, said second control electrode being connected to the opposite side of said capacitor from said first control electrode, said second main electrode being connected to the junction point of said capacitor and said first control electrode, and said third main electrode being selectively connected to a variable electrical signal source.

16. An image pickup apparatus according to claim 15, wherein said capacitor includes a MOS capacitor.

17. An image pickup apparatus comprising:

(a) a pickup element including a plurality of non-destructively readable photoelectric conversion elements disposed in a matrix including rows and columns; and (b) input means for inputting electric charges to said respective photoelectric conversion elements in a row unit, said input means including an input member selectively connected to a variable electrical source and conversion means for deriving and inputting electric charges corresponding to a variable electrical signal from said variable electrical source to said respective photoelectric elements in a row unit.

18. An image pickup apparatus comprising:

(a) an image pickup element including a plurality of arranged non-destructively readable photoelectric conversion elements, each of said photoelectric conversion elements including an active element which comprises a bipolar transistor for an amplification function; and (b) input means for inputting electric charges to each of said photoelectric conversion elements, said input means including an input member connected to a variable electrical signal source and conversion means for inputting electrical charges corresponding to a variable electrical signal from said variable electrical signal source to each of said photoelectric conversion elements.

* * * * *

UNITED STATES PATENT AND TRADEMARK OFFICE
CERTIFICATE OF CORRECTION

PATENT NO. : 4,712,138
DATED : December 8, 1987
INVENTOR(S) : KENJI KYUMA, ET AL.

It is certified that error appears in the above-identified patent and that said Letters Patent is hereby corrected as shown below:

AT [57] IN THE ABSTRACT

Line 1, "pickup-and" should read --pickup--.

COLUMN 2

Line 23, "a" should be deleted.
    Line 28, "150878/1981" should read --150878/1981,--.
    Line 66, "photographied" should read --photographed--.
    Line 67, "relative" should read --relatively--.

COLUMN 3

Line 65, "elements a" should read --elements in a--.
    Line 68, "an" should read --and--.

COLUMN 4

Line 1, "elements" should read --elements in--.
    Line 34, "FIG.8;" should read --FIG. 8.--.

COLUMN 5

Line 20, "aluminium" should read --aluminum--.
    Line 63, "semi-conductor" should read --semiconductor--.
    Line 65, "are a" should read --area--.

COLUMN 7

Line 6, "gradiant" should read --gradient--.

UNITED STATES PATENT AND TRADEMARK OFFICE
CERTIFICATE OF CORRECTION

PATENT NO. : 4,712,138

DATED : December 8, 1987

INVENTOR(S) : KENJI KYUMA, ET AL.

It is certified that error appears in the above-identified patent and that said Letters Patent is hereby corrected as shown below:

COLUMN 8

Line 23, "structure" should read --structures--.
Line 31, "cells 110" should read --cell 110--.
Line 60, "reflesh" should read --refresh--.

COLUMN 9

Line 63, "$T_5$" should read --$t_5$--.

COLUMN 10

Line 51, "character" should read --characters--.

COLUMN 11

Lines 37-38, "photographied" should read --photographed--.
Line 47, "are" should read --is--.

UNITED STATES PATENT AND TRADEMARK OFFICE
CERTIFICATE OF CORRECTION

PATENT NO. : 4,712,138

DATED : December 8, 1987

INVENTOR(S) : KENJI KYUMA, ET AL.

It is certified that error appears in the above-identified patent and that said Letters Patent is hereby corrected as shown below:

COLUMN 12

Line 11, "conversion" should read --conversion elements--.

Signed and Sealed this

Nineteenth Day of July, 1988

Attest:

DONALD J. QUIGG

Attesting Officer     Commissioner of Patents and Trademarks